TUNNEL DIODE MANUFACTURING APPARATUS
Filed May 25, 1966
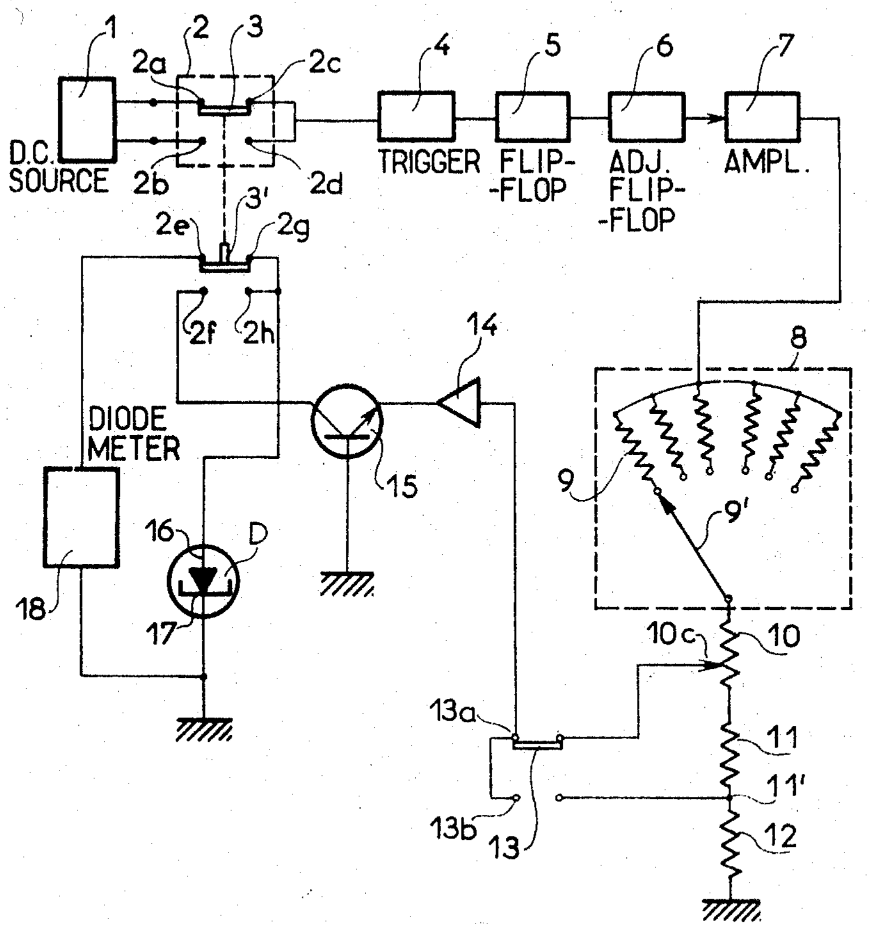

United States Patent Office 3,461,546

Patented Aug. 19, 1969

3,461,546

TUNNEL DIODE MANUFACTURING APPARATUS

Francis Boulet, Bures-sur-Yvette, and Jean Polledri, Sainte-Genevieve-des-Bois, France, assignors to Compagnie Generale d'Electricite, Paris, France Filed May 25, 1966, Ser. No. 552,908
Claims priority, application France, May 31, 1965, 18,996
Int. Cl. H01l 7/00
U.S. Cl. 29—569 7 Claims

ABSTRACT OF THE DISCLOSURE

An apparatus is described for use in the manufacture of tunnel diodes and comprises a first selector switch for developing a single trigger signal pulse at an operator's discretion and applying a shaped, current pulse of known magnitude and time duration to a tunnel diode to be formed. For this purpose, a first monostable multivibrator is coupled to the output of the first selector switch for producing a second trigger signal pulse of greater time duration than the maximum time duration of the closing of the first selector switch. A second adjustable monostable multivibrator is coupled to the output and controlled by the first monostable multivibrator and produces an adjustable time duration current pulse. An adjustable impedance network is operatively coupled to the output of the second adjustable monostable multivibrator and serves to develop at its output an adjustable time duration current pulse of known magnitude. A second selector switch connects the adjustable time duration, known magnitude current pulse appearing across the output of the adjustable impedance network to the tunnel diode to be formed.

This invention relates to a tunnel diode manufacturing process, its product, and to the apparatus for carrying out such process.

More particularly, the invention relates to an electric discharge manufacturing process of germanium tunnel diodes having a high peak current/valley current ratio (a quantity hereinafter called merit factor).

Strongly doped diodes which are fabricated to exhibit tunnel effects present in their current-voltage characteristic a negative slope portion between a current maximum, called "peak current," and a current minimum, called "valley current." For all practical purposes, the higher that this merit factor ratio can be made, the larger the number of practical circuit applications in which the tunnel diode can be used. Hence, the size of the potential market for a given tunnel diode is determined by its merit factor.

It is a primary purpose of the present invention to provide a manufacturing process and apparatus for improving the merit factor of tunnel diodes.

The process of forming a tunnel junction by means of an electric discharge is known. In French Patent 1,334,356 of May 28, 1962, an electric current is passed between a germanium type N substrate with an impurity concentration between $5\times10^{19}$ and $2\times10^{20}$, and an aluminum wire.

In the above-mentioned known process, the voltage applied between the type N germanium substrate and the aluminum wire is maintained constant, and the current is cut by an ammeter relay when it reaches a predetermined intensity. This results in relatively long and imperfectly determined times, because, in general, the current break is not instantaneous and decreases in an exponential manner. In these conditions, a thickening of the junction is produced which results in a relatively weak merit factor, for example, less than 3. The known alloy processes furnish high merit factor tunnel diodes; however, they are not so economical as the electrical discharge process. Therefore, improvemet of the electrical discharge process would appear to offer considerable practical advantages.

It is known that extreme thinness of the junction is necessary for the tunnel effect to obtain as high a merit factor as possible, and the junctions must not have a thickness greater than a few angstroms. By means of the present invention, a thinner junction, and thus a higher merit factor, is obtained by applying an impulse of current whose duration, form, and crest values are well determined.

According to the invention, in the fabrication of a tunnel diode, a substrate of semi-conductor material, for example, germanium containing an appropriate impurity, for example, arsenic, is connected to the positive pole of a source of electric current. An aluminum wire in contact with the said substrate is connected to the negative pole of the current source. This source is capable of delivering a brief rectangular form current impulse lasting between 100 and 1,000 microseconds, and having rise and fall times less than 15 microseconds and a crest value approximately between 1 and 12 amperes, for example.

According to another characteristic of the invention, the process consists of first a prewelding of the aluminum wire on the substrate by means of a relatively weak current, for example 10 ma., then applying a welding current furnishing a first peak current value slightly less than the desired nominal peak current value and then a second welding current a bit higher, permitting the adjustment of the peak current of the diode to the desired nominal value.

According to a feature of the present invention, the welding current impulse is independent of the dynamic resistance R*d* of the tunnel diode to be produced which can range between two limits $$0\leq Rd\leq\frac{V_1 \text{ supply}}{I_1 \text{ welding}}$$

The invention will be described in a more detailed fashion in connection with the single figure of the drawing which is a functional block diagram of an impulse generator apparatus having an output current adjustable in duration and intensity, used in the manufacture of high merit factor tunnel diodes in accordance with the invention.

In the figure, reference numeral 1 represents continuous direct current source of potential providing two different potentials $V_1$ and $V_2$, and reference numeral 2 is a selectively operable push-button switch means with four coacting sets of fixed contacts *2a–2c*, *2b–2d*, *2e–2g*, and *2f–2h* and movable contacts 3 and 3'. Closure of the movable contact element 3 on the lower fixed contacts *2b* and *2d* applies the $V_2$ potential of the said source 1 across the input terminals of a trigger circuit 4, while closure of the contacts 3' on its lower fixed contact *2f* and *2h* supplies a current impulse to the elements of a tunnel diode D being formed. Tunnel diode D comprises an aluminum wire F and a germanium N doped substrate P.

Upon closure of contacts 3 and 3′ on their lower contacts by an operator depressing push-button switch 2, a first trigger signal pulse is produced by the trigger circuit 4 and applied to the input of a first monostable multivibrator 5. First multivibrator 5 produces a shaped, second trigger signal pulse that has a time duration at least equal to, but preferably greater than the time duration of the closing of the push-button 2. Push-button 2 is designed such that upon being depressed so that its lower fixed contacts 2b–2d and 2f–2h are closed, it will remain in this position for a predetermined period of time sufficient to allow a maximum time duration current pulse to be applied to the diode D through contacts 2f and 2h.

The output from first multivibrator 5 is applied as a trigger signal to a second adjustable monostable multivibrator 6 for producing an output current pulse of adjustable time duration. This adjustable time duration current pulse is amplified by a pulse amplifier 7, and applied to an adjustable impedance network for controlling the magnitude of the current pulse derived therefrom. The adjustable impedance network is comprised by a plurality of stepped varying value resistors 8 having a movable selector 9 connected in series-circuit relationship with a slide rheostat 10 having a sliding contact 10c, and with fixed voltage divider resistors 11 and 12.

Sliding contact 10c of rheostat 10 is connected through the contacts *a* of push-button double throw switch 13 to the input of a direct coupled amplifier 14. Switch 13 has a second set of contacts *b* which serve to connect a lower magnitude potential appearing across the fixed resistor-dividers 11 and 12 to the input of amplifier 14.

Amplifier 14 has its output coupled through a power transistor 15 having base, collector, and emitter electrodes B, C, and E, respectively, connected with a grounded base. The output of amplifier 14 is coupled to the emitter E of transistor 15, and the collector of 15 is connected to supply adjustable controlled current through contacts 2f–2h of push-button switch 2 to the diode D to be formed. In order to measure and observe the current pulses, a measuring device 18 comprising a diode meter, is connected across the diode D through contacts 2e–2g uopn movable contact 3′ being automatically returned to its upper position at the end of each impulse period.

The operation is as follows:

The time duration of the power current pulse produced by monostable multivibrator 6 is adjusted to a desired length, and the intensity of the pulse is regulated by means of the movable selector 9 and the sliding contact 10c of the rheostat 10. For example, monostable multivibrator 6 could be adjusted so that the duration of the impulses could have the following values: 100, 200, 400, 1,000 $\mu$s. The current pulses supplied to the forming diode can be divided into six magnitude ranges by selector contact 9 so as to fall within the respective maximum values: 1, 2, 4, 8, 10, 12 a. Variation within the ranges cited is achieved with the sliding contact 10c. The rising time of the current pulses thus produced is on the order of 10 $\mu$s, the fall, 15 $\mu$s.

The transistor 15 being mounted with its base grounded, exhibits a relatively high internal impedance, and functions practically as a short-circuit for the current pulses applied therethrough. This means that, no matter what the resistivity variations of the germanium are during the formation, the output current will be constant during the duration of a formation current impulse at the predetermined adjusted value.

Prior to the application of the power current pulse, however, the push-button 13 is thrown to the *b* position and a pulsed current on the order of 10 milliamperes is generated by the above circuit and passed through the diode D in a manner to accomplish a relatively light welding, or prewelding of the aluminum wire F to the germanium substrate P. The push-button 13 is then placed in position *a*, and a power impulse is supplied to diode D having a desired time duration and a magnitude in one of the six intensity scales set forth above. Most often the latter operation will never be performed more than two times. For example, if the peak current of the tunnel diode must be 10 ma., a first impulse of the correct value to obtain a slightly lower value will be applied: for example, 1.5 a., giving the tunnel diode a peak current of 9.2 ma. Then, by appropriate adjustment of the selector contact 9 and/or sliding contact 10c again, a second, more intense impulse is applied, for example, 1.7 a., giving the tunnel diode a peak current of 9.9 ma., for example. Subsequent to the application of each such current pulse, the switch contact 3′ is returned to its upper contact to provide a reading with the diode meter 18.

It is understood that the above-mentioned numerical values are only given as examples.

Tunnel diodes manufactured according to the process and with the apparatus of the invention have been produced which have a peak current/valley current ratio on the order of 5. Diodes manufactured heretofore according to known electrical discharge processes, have exhibited a ratio not greater than 3. It can be appreciated therefor that the invention makes available a comparatively inexpensive manufacturing process and apparatus for greatly improving the merit factor of tunnel diodes.

Having described one embodiment of a tunnel diode manufacturing process, product, and apparatus in accordance with the invention, it is believed obvious that other modifications and variations are possible in the light of the above teaching. It is therefore to be understood that changes may be made in the particular embodiment of the invention described which are within the full intended scope of the invention as defined by the appended claims.

We claim:

1. An apparatus to manufacture tunnel diodes comprising first switch means for generating a single trigger signal pulse at an operator's discretion and applying a shaped current pulse to a diode to be formed, first monostable multivibrator means coupled to the output of the first switch means for producing a second trigger signal pulse of greater time duration than the maximum time duration of the closing of said first switch means, a second adjustable monostable multivibrator means coupled to and controlled by said first monostable multivibrator means for producing an adjustable time duration current pulse, an adjustable impedance network operatively coupled to the output of second adjustable monostable multivibrator means, and second switch means connected to the output from said adjustable impedance network and operable independently of said first switch means for applying current pulses of a desired magnitude and time duration from the adjustable impedance network to the diode to be formed.

2. The apparatus set forth in claim 1, wherein the adjustable impedance network comprises a series arrangement of a stepped adjustable resistor bank and sliding contact variable resistor and a fixed resistor voltage divider, said second, independently operable switch means being selectively connectable to said sliding contact variable resistor and to said fixed resistor voltage divider for selectively applying current pulses of different magnitude to the diode being formed.

3. The apparatus set forth in claim 2, wherein the first switch means comprises two sets of selectively operable contact means for selectively and simultaneously applying the first trigger signal pulse to the first monostable multivibrator means and applying the output from the second switch means to the diode to be formed.

4. The apparatus set forth in claim 3, further characterized by a power transistor interposed between the output of the second switch means and the diode to be formed.

5. The apparatus set forth in claim 4, wherein the power transistor is connected with a common base.

6. The apparatus set forth in claim 5, further characterized by amplifying means interposed between the second adjustable monostable multivibrator means and the adjustable impedance network, and between the second switch means and the power transistor, and by measuring instrument means operatively coupled across the diode to be formed for monitoring the effect of the current pulses applied thereto.

7. The apparatus set forth in claim 3 further characterized by amplifying means comprising a power transistor interposed between said second switch means and a second set of contacts of said first switch means for applying current pulses to the diode to be formed.

References Cited

UNITED STATES PATENTS

| | | | |
|---|---|---|---|
| 2,676,228 | 4/1954 | Shive | 29—584 X |
| 3,244,909 | 4/1966 | Henderson | 307—265 |
| 3,270,215 | 8/1966 | Mellott et al. | 307—273 |

PAUL M. COHEN, Primary Examiner

U.S. Cl. X.R.

29—586; 307—265; 328—59, 191, 207